United States Patent [19]
Nishi et al.

[11] Patent Number: 5,255,429
[45] Date of Patent: Oct. 26, 1993

[54] COMPONENT MOUNTING APPARATUS

[75] Inventors: Naomi Nishi, Osaka; Hideki Yoshihara, Moriguchi; Setsuo Horimoto, Katano, all of Japan

[73] Assignee: Matsushita Electric Industrial Co., Ltd., Osaka, Japan

[21] Appl. No.: 863,555

[22] Filed: Apr. 7, 1992

[30] Foreign Application Priority Data

Apr. 9, 1991 [JP] Japan .................................. 3-075522

[51] Int. Cl.$^5$ ............................................. H05K 3/30
[52] U.S. Cl. ........................................ 29/720; 29/740; 29/743; 901/40
[58] Field of Search .................. 29/740, 741, 743, 720; 901/40, 41, 44, 47

[56] References Cited

U.S. PATENT DOCUMENTS 4,858,308  8/1989  Komori ................................. 29/740
5,018,936  5/1991  Izumi et al. ....................... 29/740 X

FOREIGN PATENT DOCUMENTS 63-16700  1/1988  Japan .

Primary Examiner—Carl E. Hall
Attorney, Agent, or Firm—Wenderoth, Lind & Ponack

[57] ABSTRACT

A component mounting apparatus includes a holding section for holding a plurality of component mounting heads, each head having a component sucking nozzle. One of the component mounting heads selectively held by the holding section can be mounted on a component mounting section. A storage section, provided on each component mounting head, stores information of each component mounting head, and a reading section, provided on the component mounting section, reads the information of the storage section.

10 Claims, 6 Drawing Sheets

COMPONENT MOUNTING APPARATUS

BACKGROUND OF THE INVENTION

The present invention relates to a component mounting apparatus for mounting a component on a predetermined substrate by sucking the component, and more particularly to a component mounting apparatus for selecting a desired component mounting head from a plurality of component mounting heads held by a holding section so as to mount the component on a component mounting section.

There are growing demands for the development of an apparatus for mounting electronic components on an electronic circuit substrate having various functions, because the kinds of electronic components and configurations thereof have been diversified in recent years. It is necessary to replace a component sucking nozzle as well as a claw for regulating the position of a component according to the size of the component to be sucked by the component sucking nozzle, the kind of components and the kind of operation. The present applicant proposed an apparatus for automatically exchanging a component mounting head in Japanese Laid Open Patent Application No. 63-16700.

According to the above apparatus, a plurality of component mounting heads, each comprising a component sucking nozzle and a claw for regulating the position of a component sucked by the component sucking nozzle, are removably installed on a component mounting section. The apparatus further comprises a component holding section which holds the component mounting heads. A predetermined component mounting head selected from the component mounting heads is installed on the component mounting section.

According to this apparatus, it is not until the cause of a failure in mounting the component is investigated that an erroneous component has been mounted on the component mounting section. Then a countermeasure is taken, which requires much time and labor.

Such erroneous mounting of a component occurs due to the erasure of the contents stored in the storage section of a control device caused by the occurrence of an abnormality, such as a power failure, or due to the input of undesired information to the contents stored in the storage section, caused by the mixing of the noise of an electric wave into a signal. Thus, the control section is incapable of deciding whether or not a predetermined component mounting head has been selected.

SUMMARY OF THE INVENTION

It is an essential object of the present invention to provide an apparatus for mounting a component on a component mounting section thereof which allows the erroneous mounting of a component mounting head to be detected when the component mounting head is being mounted on the mounting section.

In accomplishing this and other objects of the present invention, according to one aspect of the present invention, there is provided a component mounting apparatus comprising a holding section for holding a plurality of component mounting heads, each having a component sucking nozzle, so that one of the component mounting head. selectively held by the holding section can be mounted on a component mounting section. A storage section is provided on each component mounting head for storing information about each component mounting head. A reading section is provided on the component mount
section for reading the information of the storage section.

According to the above construction, if the erroneous mounting of components or a power failure has caused the contents of a control device to be erased, or if the mounting head is not at a predetermined position, or if the holding position of the predetermined component mounting head is not known, the reading section provided on the component mounting section reads the information of the storage section provided on each component mounting head. Thus, a desired component mounting head is selected and can be mounted on the component mounting section.

BRIEF DESCRIPTION OF THE DRAWINGS

The above and other objects and features of the present invention will become apparent from the following description of preferred embodiments thereof with reference to the accompanying drawings, in which.

DETAILED DESCRIPTION OF THE INVENTION

Figure 1:
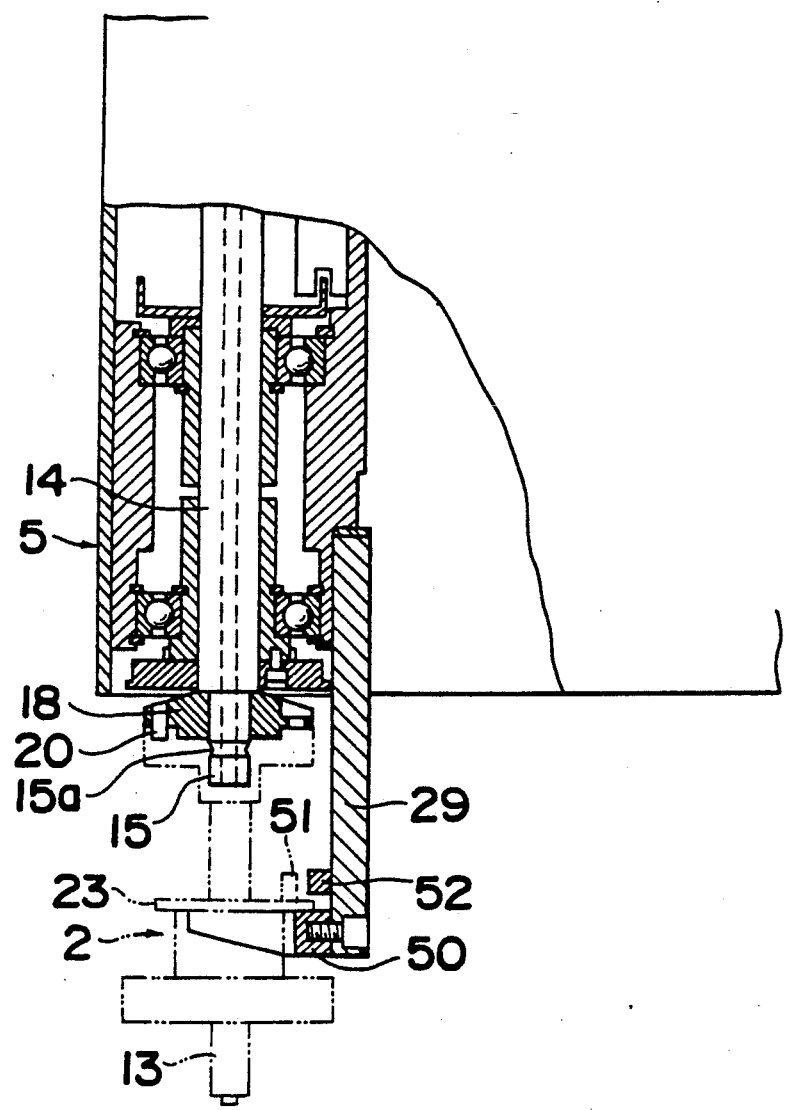
FIG. 1 is a side elevation, partly in section, showing a moving device serving as a component mounting section of a component mounting apparatus according to an embodiment of the present invention.

Before the description of the present invention proceeds, it is to be noted that like parts are designated by like reference numerals throughout the accompanying drawings.

Referring to FIGS. 1 through 10, a component mounting apparatus according to an embodiment of the present invention will be described below.

Figure 2:
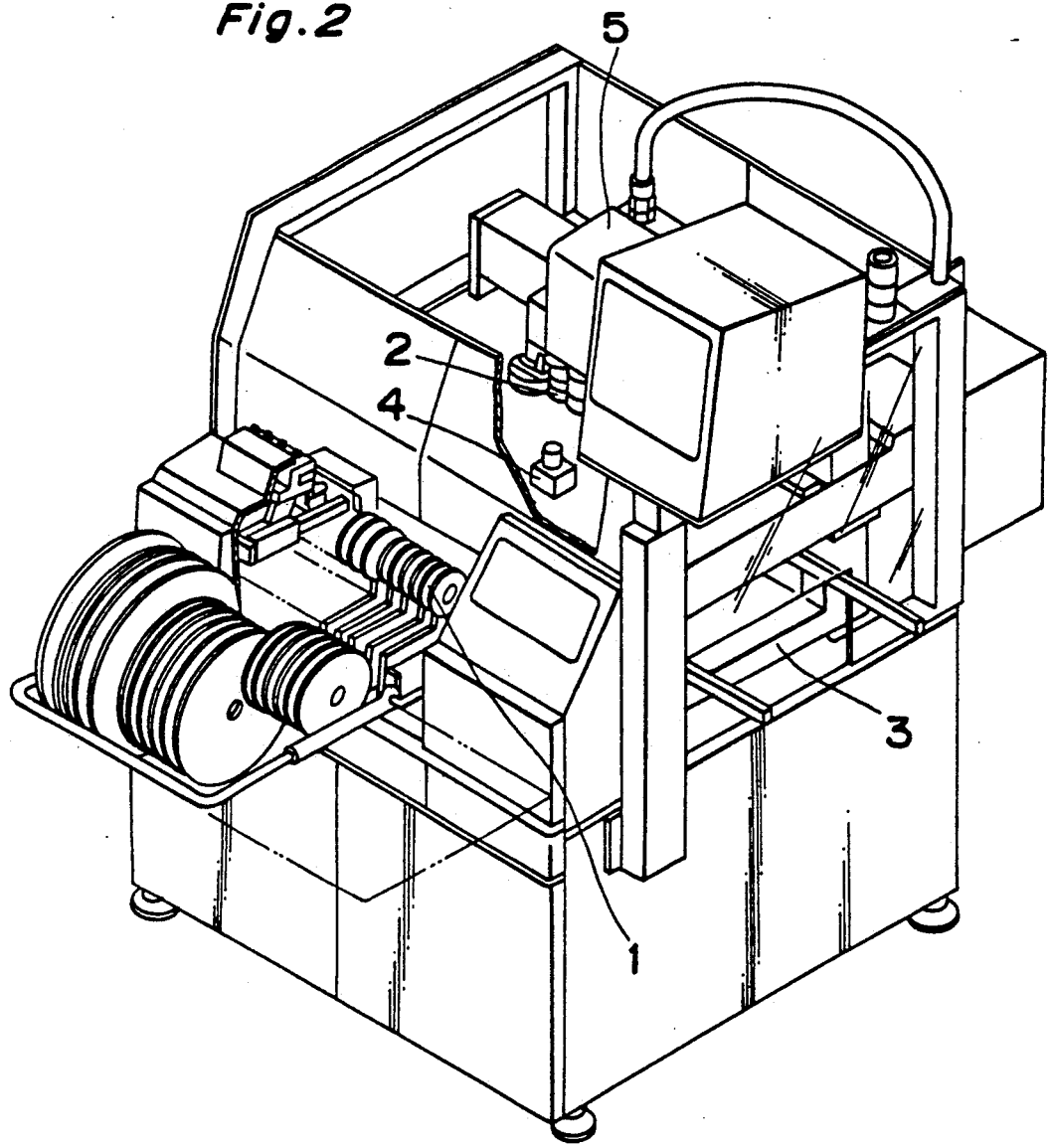
FIG. 2 is a perspective view showing the component mounting apparatus of FIG. 1.

As shown in FIG. 2, the apparatus comprises a component supply section 1, a component mounting head 2, a transporting device 3 for transporting a circuit substrate and an exchanging device 4 for exchanging the component mounting head 2. The component mounting head 2 is mounted on a moving device 5, serving as a component mounting section, movable in X-Y direction, namely, between the component supply section 1, the circuit substrate placed at a predetermined position of the transporting device 3 and the exchanging device 4.

The component mounting head 2 will be described in detail with reference to FIGS. 1, 3, and 4. A hollow shaft 11 has a supporting flange 12 at the upper end thereof and a sucking nozzle 13, urged to be movable downward, at the lower end thereof. A mounting hole 16 is formed on the upper end of the hollow shaft 11. An insertion section 15 formed on the lower end of a hollow supporting shaft 14, movable downward from the moving device, is engagedly inserted into the mounting hole 16. The supporting flange 12 has a locking ball 17 thereon, which elastically projects therefrom into the mounting hole 16 and engages an engaging groove 15a formed in the insertion section 15. A plate 18 with a socket joint to be joined with the upper surface of the supporting flange 12 is installed above the insertion section 15 of the supporting shaft 14. A rotation stopping pin 20, projecting from the plate 18, engages a pin hole 19 formed in the supporting flange 12.

An illuminating section 21 is slidably and rotatably installed around the hollow shaft 11. A flange 23 is formed on the illuminating section 21. The illuminating section 21 is urged downward by a compression spring 22 so that the flange 23 contacts a flange receiving member 50 at the side of the moving device. A pin 24 formed on the flange 23 engages a groove (not shown) formed in the flange receiving member 50. The compression spring 22 urges the illuminating section 21 through a bearing 25, thus preventing the hollow shaft 11 from restricting the slidable and rotary movement of the illuminating section 21 and preventing the illuminating section 21 from restricting the slidable and rotary movement of the hollow shaft 11.

The illuminating section 21 comprises a printed board 27 and light emitting diodes 26 mounted thereon. Electrode pins 28a and 28b are provided to supply electric power to the light emitting diodes 26.

A plate 29 holding the flange receiving member 50 has electrodes 30a and 30b opposed to the electrodes 28a and 28b, respectively. When the supporting flange 12 contacts the plate 18, the electrodes 28a and 28b are brought into contact with the electrodes 30a and 30b, respectively, to supply electric power to the light emitting diodes 26.

A storage section 51, such as an IC memory, is provided on the upper surface of the flange 23 of the component mounting head 2. In opposition to the storage section 51, a reading/writing section 52 is provided on the plate 29 on the side of the moving device so that the storage section 51 and the reading/writing section 52 communicate with each other for reading and writing operations. The storage section 51 stores the information of the sucking nozzle 13, that of both large and small components to be sucked by the sucking nozzle 13, that of both high and low speeds of the large and small components, and numbers for distinguishing components from each other. According to the embodiment, a larger diameter sucking nozzle 13 is used for a large component and a small diameter sucking nozzle 13 is used for a small component. Therefore, it is necessary to selectively use the component mounting head 2 having the sucking nozzle 13 appropriate for each component in sucking many kinds of components. In exchanging one component mounting head 2 with another one, the reading/writing section 52 reads the information of the storage section 51 under an instruction issued by a control device, thus transmitting the read information to the control device. If the control device decides that the component mounting head 2 has been appropriately selected, the selected component mounting head 2 is used. If the control device decides that the component mounting head 2 has been inappropriately selected, the selected component mounting head 2 is replaced with another component mounting head 2. Thus, no erroneous component mounting head 2 is selected.

The storage section 51 stores the number of components sucked by the sucking nozzle 13, the number of components erroneously sucked by the sucking nozzle 13, and the number of components inappropriate in the posture thereof. Under an instruction issued by the control section, is information is written by the reading/writing section 52 immediately before the component mounting head 2 is replaced. Thus, the percentage of erroneous components can be known for each sucking nozzle 13. If the percentage is equal to or greater than a predetermined value, for example, 0.1%, the use of the component sucking nozzle 13 is stopped in order to reduce the sucking error.

The detailed description of the device 4 for replacing the component mounting head 2 installed on the moving device 5, serving as the component mounting section, is described below with reference to FIGS. 5 through 10. Referring to FIGS. 5 through 8, three pairs of guide rods 42, each comprising upper and lower rods, are provided in parallel with each other between a pair of brackets 41 spaced a certain interval from each other. A holding member 43 is movably mounted on each guide rod 42. Each holding member 43 comprises a movable member 44 movably supported by the guide rod 42 and a holding section 45 for holding a component mounting head 2 positioned above each movable member 44.

Figure 8:
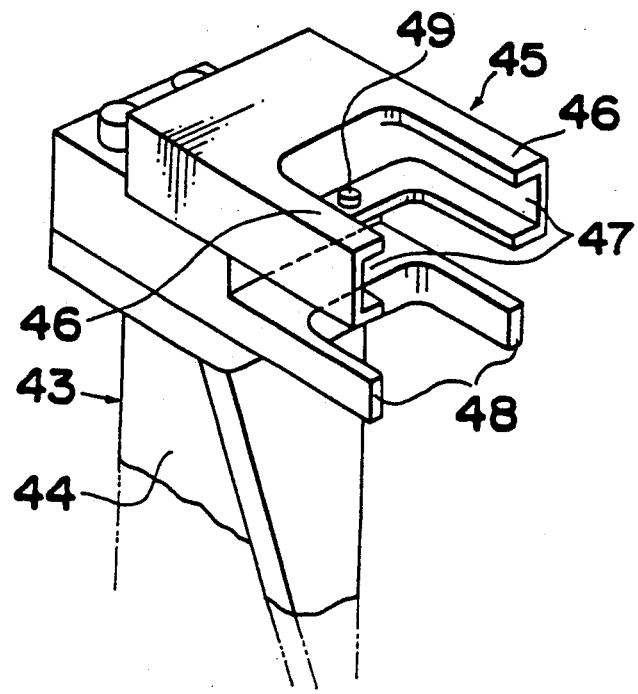
FIG. 8 is a perspective view partly showing the device for exchanging the component mounting had.

The holding member 45 is approximately U-shaped in plan view. That is, one side of the holding member 45 is opened in the moving direction of the movable member 44. As shown in FIG. 8, the holding section 45 comprises a holding groove 47 into which the peripheral portion of the supporting flange 12 of the component mounting head 2 is engagedly inserted. The holding groove 47 is formed on the inner surface of the supporting members, 46 each positioned on both sides of the upper portion of the holding section 45. The holding section 45 has, below the supporting members 46, a flange receiving member 48 for receiving the flange 23 of the component mounting head 2 thereon. The flange receiving member 48 receives the flange 23 with a compression reaction generated as a result of the compression of the compression spring 22 applying an urging force to the flange 23. There is provided, in the center portion of the supporting members 46, a positioning pin 49 for positioning the component mounting head 2, which engages a cut-out 12a shown in FIG. 3 formed on the peripheral surface of the supporting flange 12.

Figure 3:
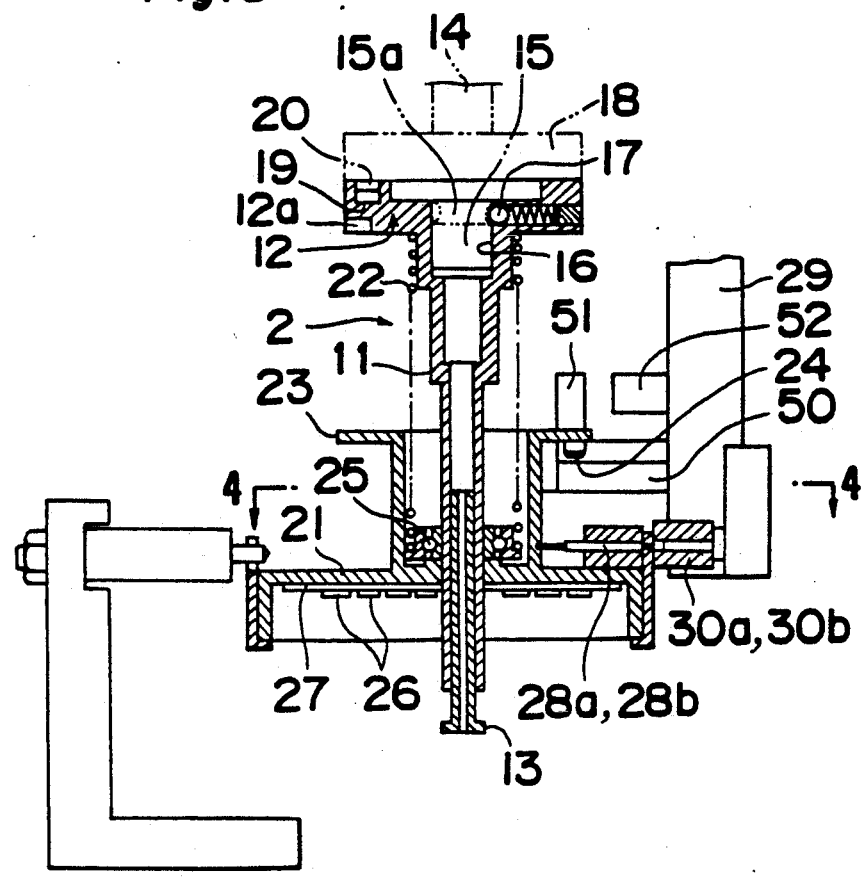
FIG. 3 is a vertical sectional view showing a component mounting head of the component mounting apparatus.
Figure 4:
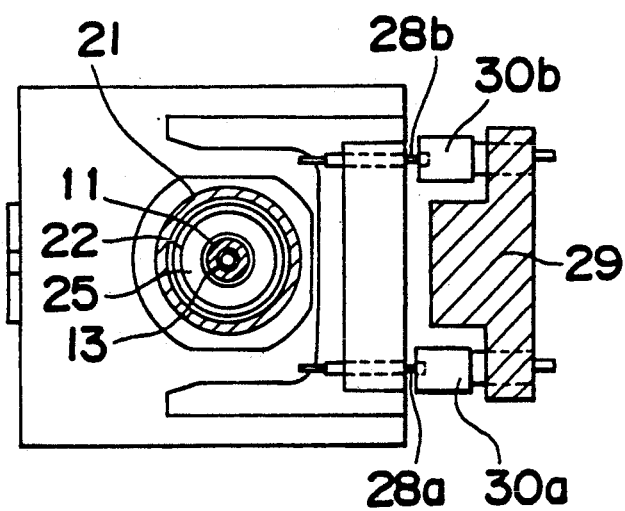
FIG. 4 is a sectional view taken along a line 4—4 of FIG. 3.

In the above construction, as shown in FIGS. 1 and 3, the insertion section 15 formed on the lower end of the supporting shaft 14 of the moving device 5 is engagedly inserted into the mounting hole 16, and the flange 23 is received by the flange receiving member 50.

Figure 5:
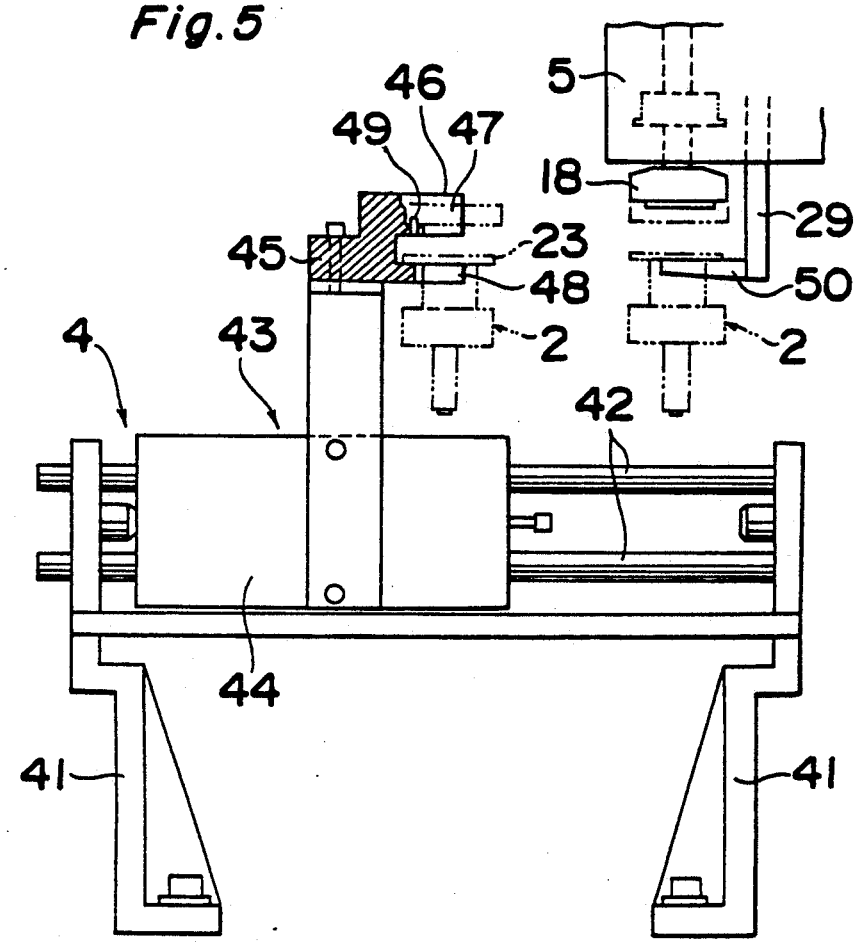
FIG. 5 is a front view, partly in section, showing a device for exchanging the component mounting head.
Figure 6:
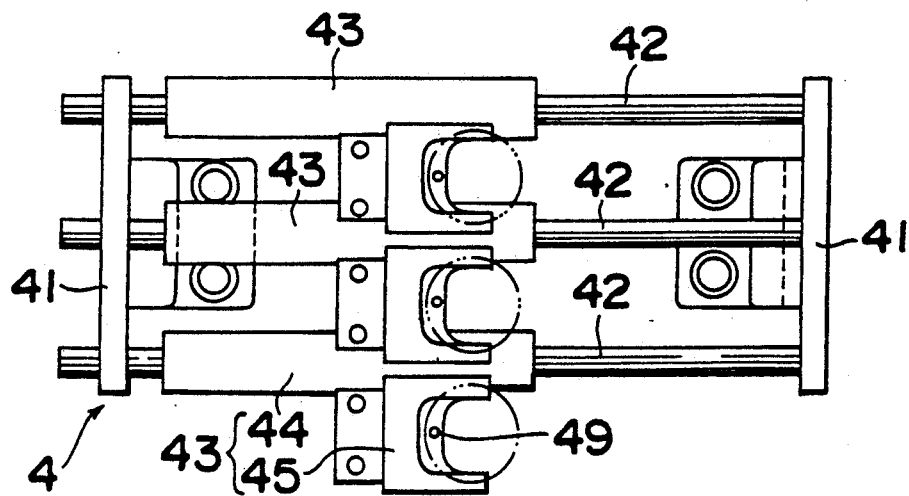
FIG. 6 is a plan view showing the device for exchanging the component mounting head.
Figure 7:
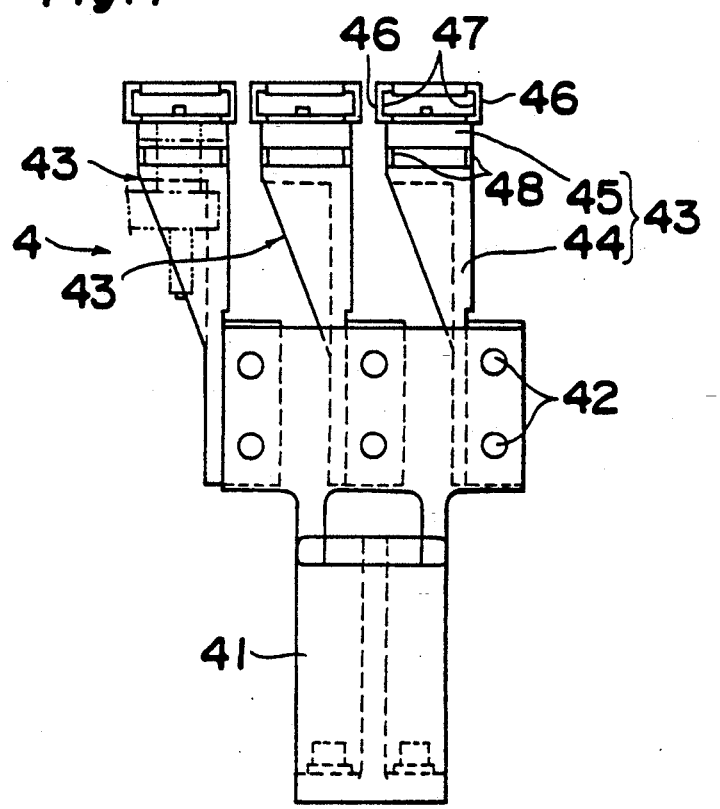
FIG. 7 is a side elevation showing the device for exchanging the component mounting head.
Figure 9:
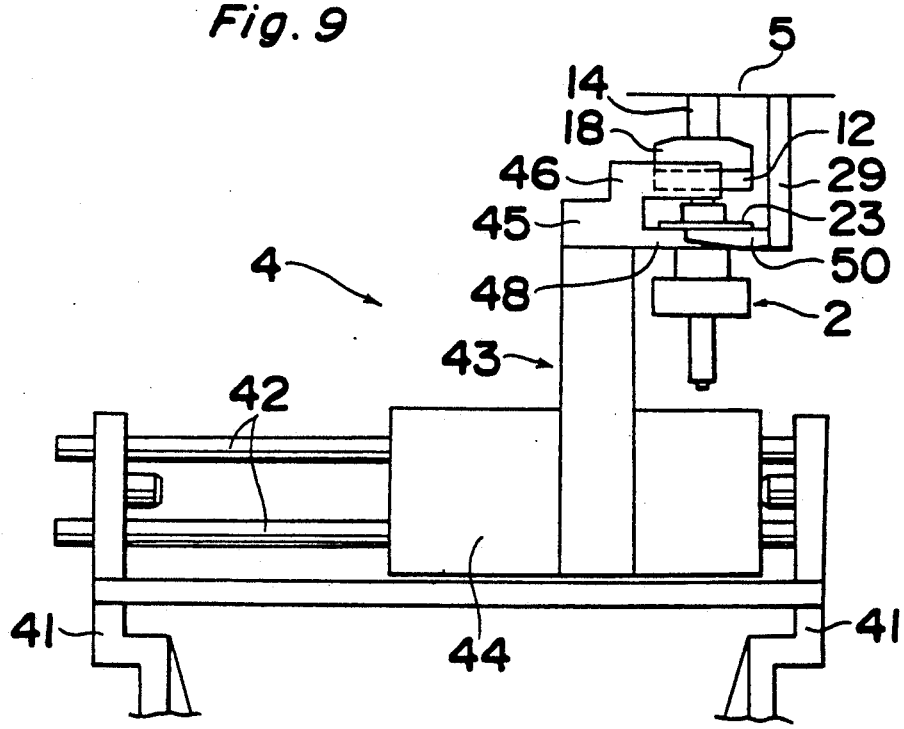
FIG. 9 is a front view showing the operation state of the device for exchanging the component mounting head.

Let it be supposed that the type of components is changed in this condition, and as such it is necessary to use a sucking nozzle 13 having a different diameter. This necessitates the component mounting head 2, mounted on the supporting shaft 14 of the moving device 5, be replaced. As shown in FIG. 5, the moving device 5 is moved to the exchanging device 4, the component mounting head 2 is positioned on the moving end of the holding member 43 having the holding section 45 on which the component mounting head 2 is not mounted, and the supporting shaft 14 is moved downward so that the supporting flange 12 is flush with the holding groove 47. The flange receiving member 50 of the moving device 5 and the flange receiving member 48 of the holding member 45 are set to be flush with each other. As shown in FIG. 9, the holding member 43 is moved toward the component mounting head 2, the supporting flange 12 is inserted into the holding groove 47, and the flange 23 is received by the flange receiving member 48. Then, the supporting shaft 14 is moved upward to pull the insertion section 15 from the mounting hole 16 and hold the component sucking nozzle 13 by the holding member 43. Then, the holding member 43 is returned to the original position as shown in FIG. 5. Thus, the component mounting head 2 is reliably held by the holding member 45 due to the compression reaction which acts on the supporting flange 12 and the flange 23.

After the moving device 5 is moved to oppose the holding member 43 holding a component mounting head 2, the holding member 43 is moved to position the component mounting head 2 directly below the supporting shaft 14 and support the flange 23 with the flange receiving member 50 as shown in FIG. 9. Then the supporting shaft 14 is moved downward to insert the insertion section 15 engagedly into the mounting hole 16. Thus, the component mounting head 2 is mounted on the moving device 5. At this time, as described previously, the control section decides whether or not the appropriate component mounting head 2 has been mounted on the apparatus in response to a signal supplied from the reading/writing section 52 which has read the content stored in the storage section 51.

Figure 10:
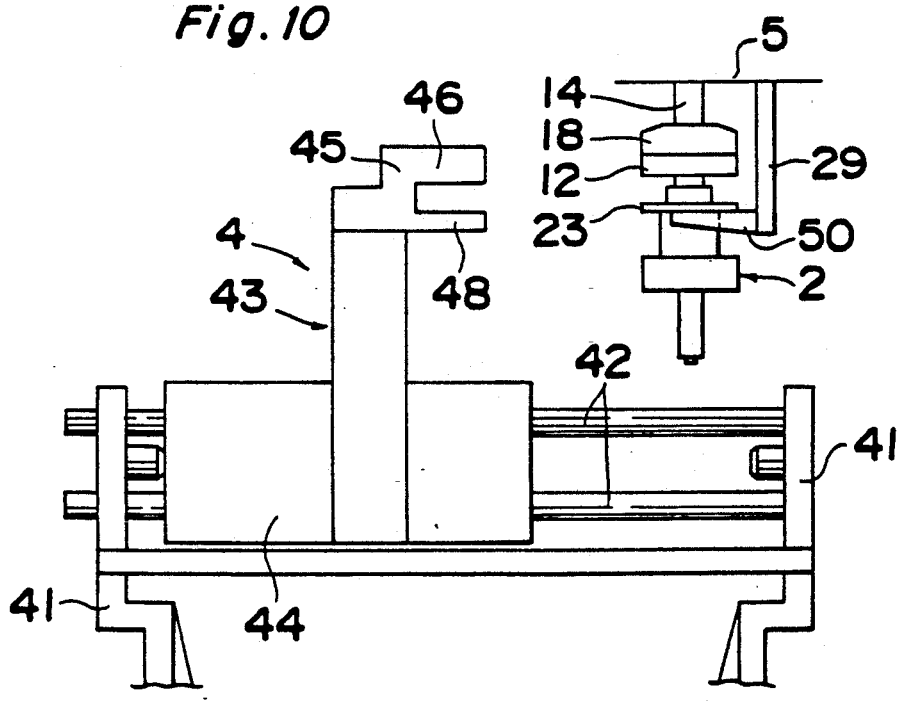
FIG. 10 is a front view showing another operation state of the device for exchanging the component mounting head.

Then, as shown in FIG. 10, the holding member 43 having no component sucking nozzle 13 mounted thereon is returned to the original position. Thus, the replacement of the component mounting head 2 is accomplished.

In addition to the above-described embodiment, it is possible to pivot the flange receiving member 50 between the horizontal flange receiving position and the downwardly-inclined waiting position. In this case, the flange receiving member 48 can be eliminated from the apparatus. Further, instead of moving the holding member 43, the moving device 5 may be moved in the engagement/disengagement direction of the supporting flange 12 in engaging the supporting flange 12 with the holding section 45 or disengaging it from the holding section 45.

The holding section 45 may have a groove and the component mounting head 2 may have a positioning pin inserted in the groove for positioning. The component mounting section 5 may have a pin hole and the component mounting head 2 may have a rotation stopping pin inserted in the pin hole for positioning.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component mounting apparatus, comprising:
   a holding section holding a plurality of component mounting heads, each said component mounting head having a component sucking nozzle;
   a component mounting section for receiving and mounting one of said component mounting heads;
   a storage section provided on each said component mounting head for storing information about said mounting head; and
   a reading section provided on said component mounting section for reading the information in said storage section;
   wherein said storage section is capable of being both read and being written to by said reading section on said component mounting section.

2. The component mounting apparatus of claim 1, wherein said storage section of each said component mounting head stores mounting information for said component mounting head.

3. The component mounting apparatus of claim 1, wherein:
   one of said holding section and a said component mounting head includes a recess and the other of said holding section and said component mounting head includes a positioning pin inserted in said recess for positioning said holding section and said component mounting had relative to each other.

4. The component mounting apparatus of claim 1, wherein:
   one of said component mounting section and a said component mounting head includes a recess and the other of said component mounting section and said component mounting head includes a positioning pin inserted in said recess for positioning said component mounting section and said component mounting head relative to each other.

5. The component mounting apparatus of claim 1, wherein said storage section on each said component mounting head comprises an IC memory.

6. A component mounting apparatus, comprising:
   a holding section holding a plurality of component mounting heads, each said component mounting head having a component sucking nozzle;
   a component mounting section for receiving and mounting one of said component mounting heads;
   a storage means provided on each said component mounting head for storing information about said mounting head, said storage means being capable of being both read from and written to; and
   a reading means provided on said component mounting section for reading the information from a said storage means and writing information to a said storage means.

7. The component mounting apparatus of claim 10, wherein said storage means of each said component mounting head stores mounting information for said component mounting head.

8. The component mounting apparatus of claim 6, wherein:
   one of said holding section and a said component mounting head includes a recess and the other of said holding section and said component mounting head includes a positioning pin inserted in said recess for positioning said holding section and said component mounting head relative to each other.

9. The component mounting apparatus of claim 6, wherein:
   one of said component mounting section and a said component mounting head includes a recess and the other of said component mounting section and said component mounting head includes a positioning pin inserted in said recess for positioning said component mounting section and said component mounting head relative to each other.

10. The component mounting apparatus of claim 6, wherein said storage means on each said component mounting head comprises an IC memory.

* * * * *